United States Patent
Jaskari et al.

(10) Patent No.: US 9,204,579 B2
(45) Date of Patent: Dec. 1, 2015

(54) POWER ELECTRONICS DEVICE AND ITS COOLING ARRANGEMENT

(71) Applicant: VACON OYJ, Vaasa (FI)

(72) Inventors: Jukka Jaskari, Vaasa (FI); Osmo Miettinen, Vaasa (FI); Juha Norrena, Mustasaari (FI)

(73) Assignee: VACON OYJ, Vaasa (FI)

(*) Notice: Subject to any disclaimer, the term of this patent is extended or adjusted under 35 U.S.C. 154(b) by 184 days.

(21) Appl. No.: 14/103,530

(22) Filed: Dec. 11, 2013

(65) Prior Publication Data

US 2014/0168897 A1 Jun. 19, 2014

(30) Foreign Application Priority Data

Dec. 13, 2012 (FI) .................................. 20126300

(51) Int. Cl.
H05K 7/20 (2006.01)
(52) U.S. Cl.
CPC .................................. *H05K 7/20927* (2013.01)
(58) Field of Classification Search
CPC .................................................. H05K 7/20927
See application file for complete search history.

(56) References Cited

U.S. PATENT DOCUMENTS

| 2,011,280 | A | * | 8/1935 | Henriksen | 470/19 |
| 4,712,609 | A | * | 12/1987 | Iversen | 165/80.4 |
| 5,349,498 | A | * | 9/1994 | Tanzer et al. | 361/689 |
| 5,933,557 | A | * | 8/1999 | Ott | 385/86 |
| 6,414,867 | B2 | * | 7/2002 | Suzuki et al. | 363/141 |
| 7,187,548 | B2 | * | 3/2007 | Meyer et al. | 361/699 |
| 9,003,649 | B1 | * | 4/2015 | Romero et al. | 29/830 |

* cited by examiner

*Primary Examiner* — Gregory Thompson
(74) *Attorney, Agent, or Firm* — Birch, Stewart, Kolasch & Birch, LLP

(57) ABSTRACT

Liquid-cooled power unit of a power electronics device, which power unit includes at least two power modules, the cooling surface of which power modules is provided with pin-type protrusions and which power modules are fixed to the frame part of the power unit. A liquid duct is arranged inside the frame part of the power unit, and the power modules are fixed to the points of the apertures situated in the frame part on both sides of the liquid duct in such a way that the pin-type protrusions of the power modules are situated in the liquid duct. A wedge-shaped part is disposed in the liquid duct, which wedge-shaped part includes a wedge-shaped front part for spreading the liquid flow into two essentially equal flows at the point of the power modules.

20 Claims, 2 Drawing Sheets

POWER ELECTRONICS DEVICE AND ITS COOLING ARRANGEMENT

FIELD OF TECHNOLOGY

Figure 1:
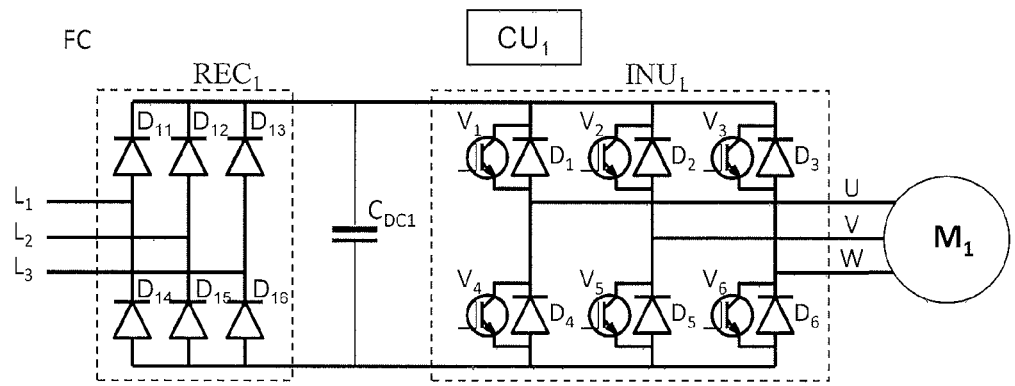

The object of this invention is an arrangement for cooling the components in a power electronics device, such as in a frequency converter.

More particularly the object of the invention is an arrangement for the cooling of power components connected in parallel.

PRIOR ART

The general development trend of power electronics devices, such as frequency converters, is an increase in power density. It is known in the art that handling of high power in a small-sized device requires effective cooling of the components handling the power, which best succeeds with liquid cooling, i.e. by transferring the dissipation power produced in the components via liquid circulating in the device to outside the device.

For reasons of cost, liquid cooling is most often used only in high-powered devices, e.g. in frequency converters of over 100 kW. Owing to the limited performance of an individual power semiconductor component, at high powers they must be connected in parallel, either in such a way that there are a number of components in parallel in the same device or by connecting whole devices in parallel to supply the same load.

Parallel connection of components in the same device is problematic particularly because each differently-powered device must have its own mechanical structural unit constructed. With serial connections it must be ensured that both the flow of cooling liquid and the load current are divided as evenly as possible between the components handling the sum power. In the case of power components connected in parallel, as is known, the requirement can result in the selection of components and/or the use of additional chokes limiting current imbalances e.g. according to patent publication U.S. Pat. No. 6,985,371, both of which methods are problematic from the viewpoint of manufacture and servicing as well as of costs. With a cooler according to prior art, inside which ducts are arranged for the flow of cooling liquid, the evenness of the flows in all the ducts and turbulence that enhances cooling are difficult to achieve, as is known in the art, which can cause problems in the cooling of components connected in parallel.

The circuits controlling controllable power components on/off, such as IGBTs, are normally disposed on circuit boards, which for electrotechnical reasons are preferably disposed as close as possible to the controllable component. Thermotechnically this sort of location is often problematic, because the internal temperature of a power component can, despite effective liquid cooling, rise to be high, e.g. to 100° C., in which case the temperature can also rise in the immediate surroundings of the component, such as in the cooler and via it also in the air space surrounding the power component, to be detrimentally high from the viewpoint of the lifetime of the components disposed on the circuit boards. For this reason a fan disposed in the interior space of the device is generally used for cooling the components disposed on a circuit board, which is a problem from the viewpoint of the reliability of the whole device because of the limited lifetime of fans.

SUMMARY OF THE INVENTION

The aim of this invention is to achieve a novel arrangement, with which the aforementioned drawbacks are avoided and a cooling liquid flow of even level is ensured at least between two power components. In addition, the arrangement according to the invention reduces the temperature of the immediate surroundings of a power component to such an extent that using fans for cooling control circuits and other components, e.g. capacitors, that are situated near the power components is unnecessary. This aim is achieved with the arrangement according to the invention, which is characterized by what is disclosed in the characterization part of the independent claim. Other preferred embodiments of the invention are the objects of the dependent claims.

The target of application of the invention is a power unit, which comprises at least two power modules that are fixed to two opposite outer sides of the frame part of the power unit. The power modules can be fixed symmetrically to the two opposite outer sides of the power unit. The disposal location of a power unit during operation of the device is a substrate, which can be common to more than one power unit. The substrate functions as a mechanical support structure for the power units disposed on it and as a connection to the main flow of the cooling liquid. In the arrangement according to the invention the cooling liquid interfaces are shaped to be compatible in such a way that a waterproof interface forms between a power unit and the substrate at the same time as the unit is fixed to the substrate, without separate fixing parts being connected to the liquid interface. The invention does not set limitations to the functionality of power modules disposed on two outer surfaces of a power unit, they can e.g. either be connected in parallel or function in different tasks.

What is also characteristic of the invention is that the liquid flows cooling the power modules disposed on two sides of the frame part of a power unit are essentially equal and directed towards the cooling surface of the power modules. This is achieved with the shaping of the liquid ducts and with a wedge-shaped part, which is installed in the liquid duct between the power modules to be cooled.

What is also characteristic of the invention is that at the point of the power modules the liquid flow is turbulent and directly rinses the cooling surface of the power modules, which produces the best possible cooling power. The turbulence is brought about by protrusions situated on the cooling surface of the type of power module belonging to the arrangement according to the invention, between which the liquid flow is forced to travel. For the purpose of the arrangement in the frame part of the power unit, at the point of the power modules to be cooled, there are apertures with their edges sealed for preventing liquid leaks.

The frame part according to the invention can be manufactured e.g. by casting into a mold for achieving low costs and small manufacturing tolerances. The precise shaping of the liquid duct is a prerequisite for achieving the symmetrical liquid flow according to the invention. The frame part can be a single-part piece or it can be composed of two symmetrical halves that are fixed together in a watertight manner.

Since the heat produced by the dissipation power of a power module in the arrangement according to the invention is transferred from the base of the module directly into the cooling liquid, the heating of the frame part of the power unit remains significantly lower than e.g. the heating of a cooler according to prior art. Owing to this, the temperature of the air in the environment of the power module being cooled remains low, in which case a prior-art fan for interior air that cools the circuit board and other components situated near the power module is not needed.

In the arrangement according to the invention the liquid duct is spacious and its flow resistance is therefore small compared to an arrangement of conventional technology, in which there are a number of cramped ducts, in which producing a liquid flow requires considerably high pressure between the ends of the duct. Owing to the low flow resistance, the pressure loss of the flow over the power unit according to the invention remains low, as a result of which the pumping power needed is low.

SHORT DESCRIPTION OF THE DRAWINGS

Figure 2:
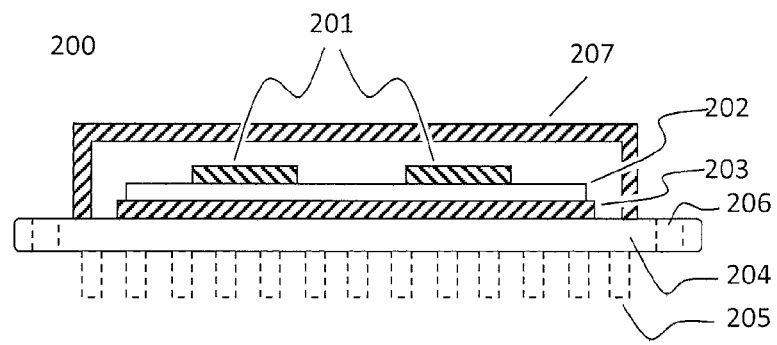
Figure 3:
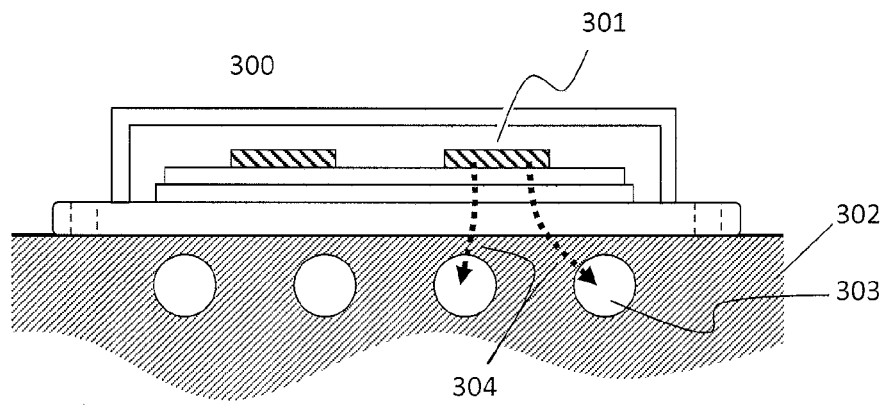
Figure 4:
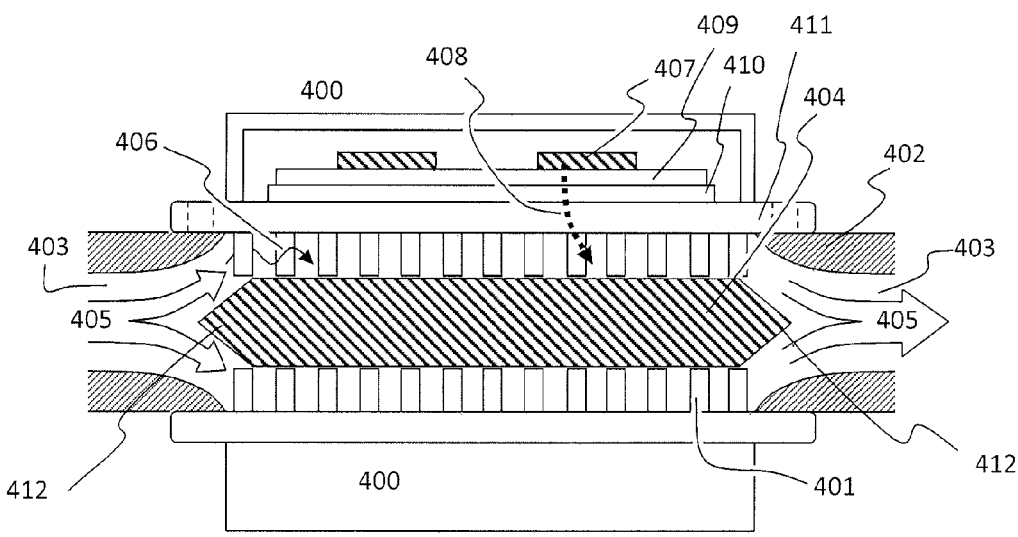
Figures 5A, 5B:
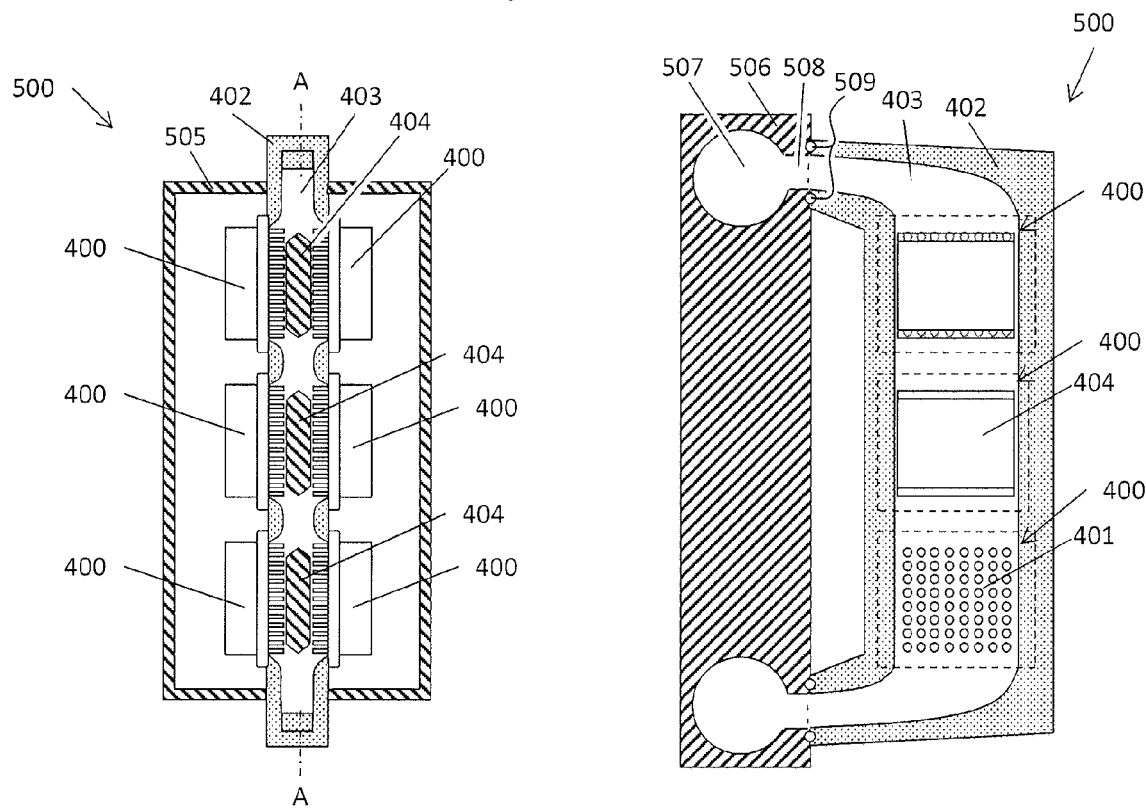

In the following, the invention will be described in more detail by the aid some embodiments with reference to the attached drawings, wherein FIG. 1 presents an embodiment of a power electronics device, in which the solution according to the invention can be used, FIG. 2 presents a cross-section of a power module, FIG. 3 presents a cooling solution according to prior art, FIG. 4 presents a cross-section of a cooling solution according to the invention, and FIGS. 5A and 5B present a cross-section of the power units according to the invention.

DETAILED DESCRIPTION OF THE INVENTION

FIG. 1 presents the main circuit of a frequency converter FC, as an example of a power electronics device in which the solution according to the invention can be used. In the device three-phase supply voltage $L_1$, $L_2$, $L_3$ is rectified with a rectifier $REC_1$, which comprises diodes $D_{11}$ ... $D_{16}$. The direct-current voltage formed is filtered with a capacitor $C_{DC1}$ into the direct-current voltage of the intermediate circuit, from which output voltage is further formed with an inverter $INU_1$, which comprises controllable power semiconductor switches, e.g. IGBTs $V_1$ ... $V_6$ and diodes $D_1$ ... $D_6$ connected in parallel with them. In the example frequency converter the output voltage poles U, V, W are normally connected to a motor $M_1$. The operation of the inverter bridge is controlled by a control unit $CU_1$.

The components of both the rectifier bridge and the inverter bridge can be mechanically integrated into their own modules, which are marked in FIG. 1 with dashed lines. A module can also comprise only one so-called phase switch, of the type formed by e.g. $V_1$, $V_4$, $D_1$ and $D_4$. FIG. 2 presents a typical structure, simplified here, of a power module 200. The power module comprises power components 201, which can be e.g. chip-type power semiconductor components (e.g. $V_1$, $D_1$), which power components 201 are connected to an insulating board 202, onto the surface of which a copper conductor pattern is etched. The insulating board 202 rests on top of a metallic base plate 203, which is in turn fixed to the metallic heat sink 204 functioning as the base part of the power module. The outer surface of the cooler can be smooth or it can have pin-like protrusions 205, the cross-section of which is most usually round. FIG. 2 presents a cooler comprising protrusions 205. Normally there are also holes 206 in the heat sink for fixing a power module to the substrate. The enclosure 207 functions as mechanical protection of the inside parts of the module and as a support base for external connections (not presented).

FIG. 3 presents a simplified view of a typical liquid cooling solution according to prior art, in which a smooth-based power module 300 is fixed to a cooler 302, inside which are ducts 303 for circulating the cooling liquid. The dashed lines 304 illustrate the traveling of the heat produced by the power chips 301 via the internal intermediate layers of the power module into the cooler 302 and onwards through it into the liquid ducts 303.

The problems with this type of cooling solution are, among others, significant thermal resistances in the interface of the power module and the cooler, and in the interface of the cooler and the liquid, especially if the flow of the liquid is laminar. It is known in the art that these problems can be alleviated with thermally conductive paste and by trying to get the flow of liquid to be turbulent with additional parts disposed in the liquid duct. In extreme conditions the surface temperatures of the cooler and the power module can, however, rise to be so high that the heat radiated by them also causes a dangerously high rise in the temperature of the air in the immediate surroundings of the power module, e.g. from the viewpoint of components disposed on the circuit board. Owing to this it is possible that the cooling of circuit boards and other components disposed near a power module must be boosted with a fan.

When connecting power modules in parallel to supply the same load, it is advantageous for them to remain the same temperature as each other as far as is practical. With the cooling solution according to FIG. 3 it is difficult to situate modules to be in an equal position with regards to cooling, when disposed consecutively in the direction of the liquid ducts owing to the warming of the liquid and, when disposed at the points of different ducts, owing to possible unequal magnitudes of the liquid flows.

FIGS. 4 and 5 present embodiments of the liquid cooling arrangement according to this invention, and the use of same in a power electronics device. The parts that are not essential from the viewpoint of describing the invention, such as electrical insulations, sealing accessories and fastening accessories, details of electrical and mechanical joints, et cetera, are not presented in the figures.

FIG. 4 describes a cross-section of an arrangement according to the invention, wherein the power modules 200 are disposed symmetrically at the points of the apertures situated in the frame part 402 of the power unit, on both sides of the liquid duct 403 situated inside the frame part. The wedge-shaped part 404 disposed in the liquid duct at the point of the power modules divides the liquid flow 405 into two essentially equal parts and directs them towards the bases of the power modules 200, which bases in the solution according to the invention are provided with pin-type protrusions 205, which bring about a turbulent flow 406 at the point of the power modules. The flow wedge 404 preferably extends to the tips of the protrusions 205, in which case the whole flow passes between the protrusions. The flow wedge 404 comprises wedge-shaped ends 409, 411 in the longitudinal direction and a frame part 410 between the ends. The transfer route of heat from a power chip into the liquid, which the dashed line arrow 408 of the figure presents, is the shortest possible in the solution according to the invention, because the heat can be transferred into the liquid directly from the base of the power module without an intermediate layer according to prior art formed by a cooler external to the power module. In addition, directing the cooling liquid towards the base of the power module and also the turbulence of the liquid flow enhance the transfer of heat into the liquid.

FIGS. 5A and 5B describe from two different directions a power unit 500, in which a cooling solution according to this invention is applied. FIG. 5A describes a cross-section of a power unit at the point of the liquid duct as viewed from the top and FIG. 5B from the cross-section line A-A.

In the embodiment of the figures the power unit comprises 6 power modules 200, which are fixed to the frame part 402 of the power unit, on both sides of the liquid duct 403 running inside it. A flow wedge 404 according to the invention is in the liquid duct 403 between each power module pair. A power unit 500 can be fixed to the substrate 506, preferably in such a way that transfer duct 508 that is specific to the power unit and connects to the frame duct 507 for cooling liquid disposed inside the substrate and the cooling liquid duct 403 are connected to each other in a watertight manner, e.g. owing to a rubber sealing ring 509, at the same time as the power unit is fixed to the substrate 506. FIG. 5B illustrates the placement of the power modules 200 (areas defined by dashed lines), flow wedges 404 and cooler protrusions 205 of the power modules in the power unit 500 and in the cooler duct 403.

In the figures the arrangement for keeping the flow wedge 404 according to the invention in its position is omitted for the sake of the clarity of the figure, but it can be implemented with numerous methods known by a person skilled in the art. If the wedge is a separate additional part, at the ends of it can be protuberances that go into corresponding depressions situated in the frame part, or the wedge can be a fixed part of the frame structure.

Since the transfer route of heat from a power module into the cooling liquid does not travel via the frame part 402 of the power module, the frame part does not therefore heat up nearly as much as a cooler according to prior art, but instead remains almost the same temperature as the cooling liquid. Owing to this the temperature of the air inside the cover 505 of the power unit remains so low that a fan for the interior air according to prior art is unnecessary.

It is obvious to the person skilled in the art that the different embodiments of the invention are not limited solely to the example described above, but that they may be varied within the scope of the claims presented below.

The invention claimed is:

1. Liquid-cooled power unit of a power electronics device, which power unit comprises at least two power modules,
   the cooling surface of which power modules is provided with pin-type protrusions, and
   which power modules are fixed to the frame part of the power unit,
   wherein
   a liquid duct is arranged inside the frame part of the power unit, and
   the power modules are fixed to the points of the apertures situated in the frame part on both sides of the liquid duct in such a way that the pin-type protrusions of the power modules are situated in the liquid duct, and
   at least one wedge-shaped part is fitted into the liquid duct, which wedge-shaped part comprises a wedge-shaped front part for spreading the liquid flow into two essentially equal flows at the point of the power modules.

2. Power unit according to claim 1, in which there are two liquid interfaces for a connection to an external liquid circulation, and in which the liquid duct is arranged in such a way that the cooling liquid can flow from the first liquid interface to the second liquid interface.

3. Power unit according to claim 1, wherein the power modules are fixed symmetrically to the points of the apertures situated in the frame part on both sides of the liquid duct.

4. Power unit according to claim 1, wherein the size of the apertures of the frame part are configured in such a way that the fixing of the power modules is watertight.

5. Power unit according to claim 1, wherein the wedge-shaped part at its thickest point fills the space between the protrusions in the center of the liquid duct.

6. Power unit according to claim 1, wherein a watertight joint forms between a substrate and the power unit, without separate fixing parts being connected to the liquid interfaces, at the same time as the power unit is fixed mechanically to the substrate.

7. Power unit according to claim 1, wherein the pin-type protrusions are arranged in such a way that they bring about a turbulent flow at the point of the power modules.

8. Power electronics device, wherein it comprises a power unit according to claim 1.

9. Power unit according to claim 2, wherein the power modules are fixed symmetrically to the points of the apertures situated in the frame part on both sides of the liquid duct.

10. Power unit according to claim 2, wherein the size of the apertures of the frame part are configured in such a way that the fixing of the power modules is watertight.

11. Power unit according to claim 3, wherein the size of the apertures of the frame part are configured in such a way that the fixing of the power modules is watertight.

12. Power unit according to claim 2, wherein the wedge-shaped part at its thickest point fills the space between the protrusions in the center of the liquid duct.

13. Power unit according to claim 3, wherein the wedge-shaped part at its thickest point fills the space between the protrusions in the center of the liquid duct.

14. Power unit according to claim 4, wherein the wedge-shaped part at its thickest point fills the space between the protrusions in the center of the liquid duct.

15. Power unit according to claim 2, wherein a watertight joint forms between a substrate and the power unit, without separate fixing parts being connected to the liquid interfaces, at the same time as the power unit is fixed mechanically to the substrate.

16. Power unit according to claim 3, wherein a watertight joint forms between the substrate and the power unit, without separate fixing parts being connected to the liquid interface, at the same time as the power unit is fixed mechanically to a substrate.

17. Power unit according to claim 4, wherein a watertight joint forms between a substrate and the power unit, without separate fixing parts being connected to the liquid interfaces, at the same time as the power unit is fixed mechanically to the substrate.

18. Power unit according to, claim 5, wherein a watertight joint forms between a substrate and the power unit, without separate fixing parts being connected to the liquid interfaces, at the same time as the power unit is fixed mechanically to the substrate.

19. Power unit according to claim 2, wherein the pin-type protrusions are arranged in such a way that they bring about a turbulent flow at the point of the power modules.

20. Power unit according to claim 3, wherein the pin-type protrusions are arranged in such a way that they bring about a turbulent flow at the point of the power modules.

* * * * *